United States Patent [19]
Hernandez et al.

[11] Patent Number: 5,263,620
[45] Date of Patent: Nov. 23, 1993

[54] WIREBOND REMOVAL APPARATUS USING ALTERNATING FLUID STREAM

[75] Inventors: Bernardo Hernandez, Norwalk, Conn.; Raymond R. Horton, Dover Plains, N.Y.; Ismail C. Noyan, Peekskill, N.Y.; Michael J. Palmer, Walden, N.Y.; Mark B. Ritter, Brookfield, Conn.

[73] Assignee: International Business Machines Corporation, Armonk, N.Y.

[21] Appl. No.: 843,693

[22] Filed: Feb. 28, 1992

[51] Int. Cl.⁵ .............................................. B26F 3/00
[52] U.S. Cl. .......................................... 225/1; 225/93; 225/97; 29/426.4; 29/762; 228/264; 228/180.5; 239/562
[58] Field of Search .................... 225/1, 2, 93, 96, 97, 225/96.5; 83/53, 177; 29/426.4, 764, 762; 239/551, 562, 67, 95, 99; 228/179, 264

[56] References Cited

U.S. PATENT DOCUMENTS 3,390,033  6/1968  Brown ........................... 29/426.4 X
3,460,238  8/1969  Christy et al. ..................... 225/93 X
4,274,576  6/1981  Shariff ............................ 29/426.4 X
5,152,447  10/1992  Wallgren et al. ................. 239/562 X Primary Examiner—Eugenia Jones
Attorney, Agent, or Firm—Daniel P. Morris

[57] ABSTRACT

A method and apparatus for removing wires bonded between chip contact pads and substrate contact pads using an alternating fluid flow is described. The fluid flow is preferably air. A nozzle having a plurality of air jets within a chip accommodating cavity is disposed over the chip to enclose the chip contact pads, the substrate contact pads and the wires bonded therebetween. Air is forced through the plurality of jets to cause an alternating clockwise and counter clockwise air flow which bends the plurality of wires back and forth until they fatigue at the contact points to the chip contact pads in a substrate contact pads which results in the wires being substantially simultaneously severed therefrom. The nozzle has an aperture out through which the air escapes carrying the severed wires therewith for collection in a filter.

20 Claims, 9 Drawing Sheets

WIREBOND REMOVAL APPARATUS USING ALTERNATING FLUID STREAM

FIELD OF THE INVENTION

This invention relates to an apparatus and method for removing a member projecting from a substrate surface by alternating the direction of a fluid flow over the projecting member. More particularly, this invention relates to an apparatus and method for removing wires bonded between contact pads on electronic devices. More particularly, this invention relates to an apparatus and method for removing wires bonded between contact pads by alternating the direction of flow of a fluid over the wire bond so that the wire is alternately pushed back and forth resulting in fatigue breaks at the point where the wire is bonded to the contact pad. Most particularly, this invention relates to an apparatus and method for substantially simultaneously removing a plurality of wires bonded between contact pads and automatically removing the severed wires.

BACKGROUND OF THE INVENTION

In the microelectronics industry, one commonly used technique for electrically connecting a semiconductor chip to a semiconductor chip packaging substrate is to dispose the back of the chip onto a packaging substrate in a region of the substrate wherein there are a plurality of substrate contact locations to surround the chip. The face of the chip which is no disposed on the substrate has a plurality of chip contact locations, typically in the vicinity of the chip periphery. Wires are bonded between the chip contact locations and corresponding substrate contact locations. The wires can be bonded to both the chip contact locations and the substrate contact locations by a variety of techniques. For example, wires can be soldered to both contact locations, wires can be thermocompression bonded to both contact locations and wires can be ultrasonically bonded to both contact locations. Any combinations of these techniques can be used to bond the wire to the chip contact location and the substrate contact location. There are variations of these commonly used techniques and there are other techniques for bonding the wire to the contact location.

Typically, the wires are aluminum wires or gold wires. Typically, the contact locations on the chip and on the substrate have commonly used metallurgies appropriate for the type of bonding which is be used to attach the wires thereto.

In contemporary and future products, increasingly larger numbers of chips will be mounted onto substrates. This will require more complex substrates having increased density which is achieved by more complex processing of the substrate. If chips which have defects are mounted onto such substrates, it is more cost effective to remove the chip and to replace it with a non-defective chip. The alternative, which is very costly, is to discard the entire substrate with good chips mounted onto a good substrate.

Removing a chip from a substrate and replacing it with another chip is commonly referred to in the art as rework. Tools are required to do rework in a cost efficient and reliable manner. Presently, chips which are wire bonded to a substrate are removed by clipping the wires with a cutting tool. This is a slow labor intensive process. Moreover, bringing a hand cutting tool close to the chip and substrate exposes both to damage from the tool which can be jammed into chip surface or substrate surface potentially damaging the top dielectric layer, the contact locations and the metallization on the surface and within the interior of the chip or substrate. Such damage can cause the chip or substrate to be non-functional. Moreover, when wires are cut using a clipping tool there is left at the substrate contact location and at the chip contact location a relatively long residual piece of wire which interferes with the rebonding operation to the contact location.

According to the present invention, an apparatus is provided wherein a jet of gas is caused to move back and forth over a plurality of wires bonded between chip contact locations and substrate contact locations. The jet of air forces the wires to be simultaneously pushed back and forth. This results in metal fatigue very close to the contact locations. The wires break at the point of contact between the wire and the contact locations all generally simultaneously thereby permitting the chip to be removed from the substrate.

U.S. Pat. No. 4,677,370 describes a magnetic tool for testing defects in a wire conductor bonded between a IC chip and a chip package. The package is placed in a magnetic field which generates currents through the conductors to induce a magnetic force. Preferably, the magnitude of the current is generated to change in a cyclic fashion to cause the wire to move back and forth. The current through the conductors is monitored to determine if a bond breaks under the force.

It is an object of the present invention to provide an apparatus and method for efficiently, reliably and cost effectively removing wires bonded between contact locations.

It is another object of the present invention to provide methods and apparatus that can remove large numbers of wires simultaneously so that a chip can be removed from a substrate in a short period of time.

Research Disclosure, September, 1990, No. 317, Kenneth Mason Publications, Ltd. England describes an inspection tool to assess ultrasonic bond quality. A picture is first taken of the bond. A brief pulse of a gas is supplied to the bond. During the time the gas jet is on a second image of the wire bond area is taken. The picture before and after the gas jet are compared. A significant movement of the wire is taken to mean a defective bond.

Japanese Patent Application 02-228437 published Sep. 11, 1990, discloses that an Au/Ag alloy is the best alloy to be used in wire bonding to reduce breakage of wires by vibration fatigue during the assembly of semiconductor chips.

U.S. Pat. No. 4,959,706 discloses an improved bonding pad having an elongated rectangular shape on which a wire is bonded at a location displaced towards an outer corner so that there is room on the pad for a second bond site to be made for a rework bond. This avoids problems associated with attempting to bond to a pad with a wire stub.

SUMMARY OF THE INVENTION

In its broadest aspect, the present invention is an apparatus and method to remove a projection from a surface by alternating a fluid over the projection to oscillate the projection back and forth until it breaks away from the surface.

In a more particular aspect of the present invention there is at least one wire bonded between two locations on a workpiece wherein an alternating fluid stream causes the wire to move back and forth thereby resulting in fatigue failure in the wire which results in the wire breaking away from the two locations on the workpiece.

In another more particular aspect of the present invention the workpiece is a chip mounted to a substrate. There are a plurality of wires which are bonded between chip and substrate contact locations, all of which are substantially simultaneously removed by alternating a fluid stream over the plurality of wires.

In another more particular aspect of the present invention, the apparatus has a nozzle which substantially encloses the chip and the substrate contact pads and the wires bonded therebetween. The nozzle has a plurality of fluid passages permitting a fluid to be passed along the edges of the chip to substantially simultaneously remove the wires bonded along all four edges of the chip.

In another more particular aspect of the present invention, the nozzle has an output port. The fluid being passed over the wire bonds escapes from the nozzle through the output port. The escaping fluid carriers the severed wires out of the nozzle output port.

In another more particular aspect of the present invention, at the nozzle output port there is provided a means for capturing the severed wires.

These and other objects, features and advantages of the present invention will become more apparent from the following more detailed description and the drawings and claims appended thereto.

BRIEF DESCRIPTION OF THE DRAWINGS

FIG. 8.1 is a cross sectional view of the structure of FIG. 8 along the line 8.1—8.1.

FIG. 9.1 is a cross sectional view of the structure of FIG. 9 along the line 9.1—9.1.

FIG. 10.1 is a cross sectional view of the structure of FIG. 10 along the line 10.1—10.1.

DETAILED DESCRIPTION

Figure 1:
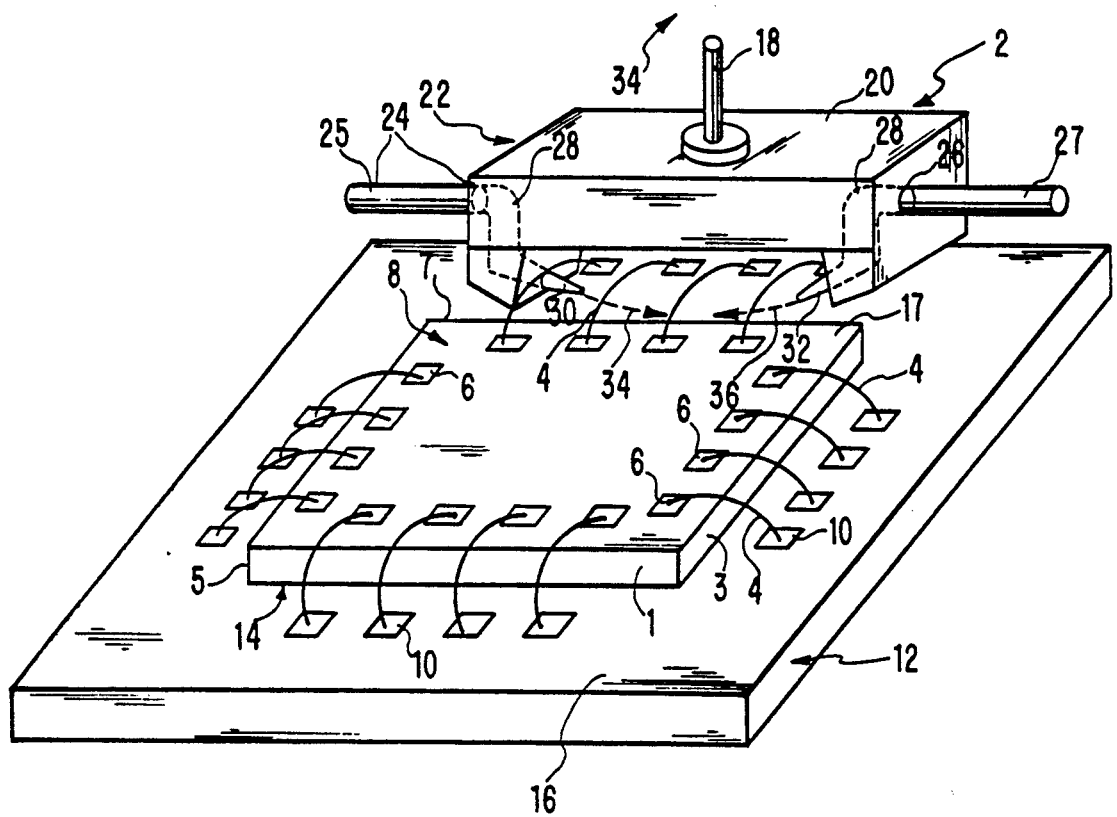
FIG. 1 shows, in perspective, an electronic device having a plurality of contact locations mounted onto a substrate having a plurality of contact locations. There are a plurality of wires bonded between the electronic device contact locations and the substrate contact locations. Additionally there is shown a nozzle which permits a flowing of fluid over the wires for severing the wires from the electronic device and substrate contact locations.

FIG. 1 shows an embodiment 2 of an apparatus of the present invention being used to remove wires 4 bonded between pads 6 on an electronic device, such as a semiconductor, chip 8 and pads 10 on packaging substrate 12. The back face 14 of semiconductor chip 8 is disposed on substrate surface 16 on which pads 10 are disposed. The semiconductor chip 8 has generally rectangular shape having four sides. On top surface 17 of semiconductor chip 8 in the vicinity of each edge 1, 3, 5 and 7 of the chip there are a plurality of pads 6 or contact locations. Surrounding the chip 8 on surface 16 of packaging substrate 12 there are a plurality of packaging substrate contact pads 10 or contact locations generally aligned with each edge of the chip. There is typically one chip contact location 6 corresponding to one substrate contact location 10. FIG. 1 shows one example of a typical workpiece for the apparatus of the present invention. Other workpieces having a wire or elongated member bonded to one or two locations on the workpiece are suitable workpieces for the present invention.

The apparatus 2 is supported by a moveable arm not shown in FIG. 1 which grips onto holding means 18. Holding means 18 is fixedly mounted to top surface 20 of apparatus 2. Top surface 20 is the top surface of a housing 22. Housing 22 is preferably formed from a block of material 22 which can be any suitable material such as aluminum, copper, a ceramic and the like. There are two fluid input ports 24 and 26 to block of material 22. Input tube 25 is connected to input port 24 and input tube 27 is connected to input port 26. Fluid input port 24 is connected by means of a channel 28 (shown in phantom in the interior to the block of material 22) to nozzle or jet 30. Input port 26 is connected by means of a channel 28 (shown in phantom in the interior to the block of material) to nozzle or jet 32. The block of material 22 in side view in a direction 34 has a generally rectangular U-shape, but is not limited to such a shape. Nozzles 30 and 32 are on the interior side of the open end of the U-shape and are generally directed towards each other at an angle directed towards the workpiece. A fluid, typically a gas and preferably air, is directed in fluid port 24 and 26. The fluid input to input ports 24 and 26 is controlled by valves (not shown) so that fluid flows alternately into input ports 24 and 26 in a repetitive cycle so that the fluid flows out from the nozzles 30 and 32 in a corresponding cyclic pattern. The fluid flow from nozzle 30 is generally indicated by dashed line 34. The fluid flow from nozzle 32 is generally indicated by dashed line 36. The fluid flow 34 pushes wires 4 in the direction of nozzle 32 and the fluid flow 36 pushes the wires in the direction of nozzle 30. For aluminum wires having length 0.1001 inch and cross sectional diameter 0.001 inch it has been found that 32 alternations from nozzles 30 and 32 is sufficient to sever the wire 4 from substrate contact location 10 and chip contact location 6.

Figure 2:
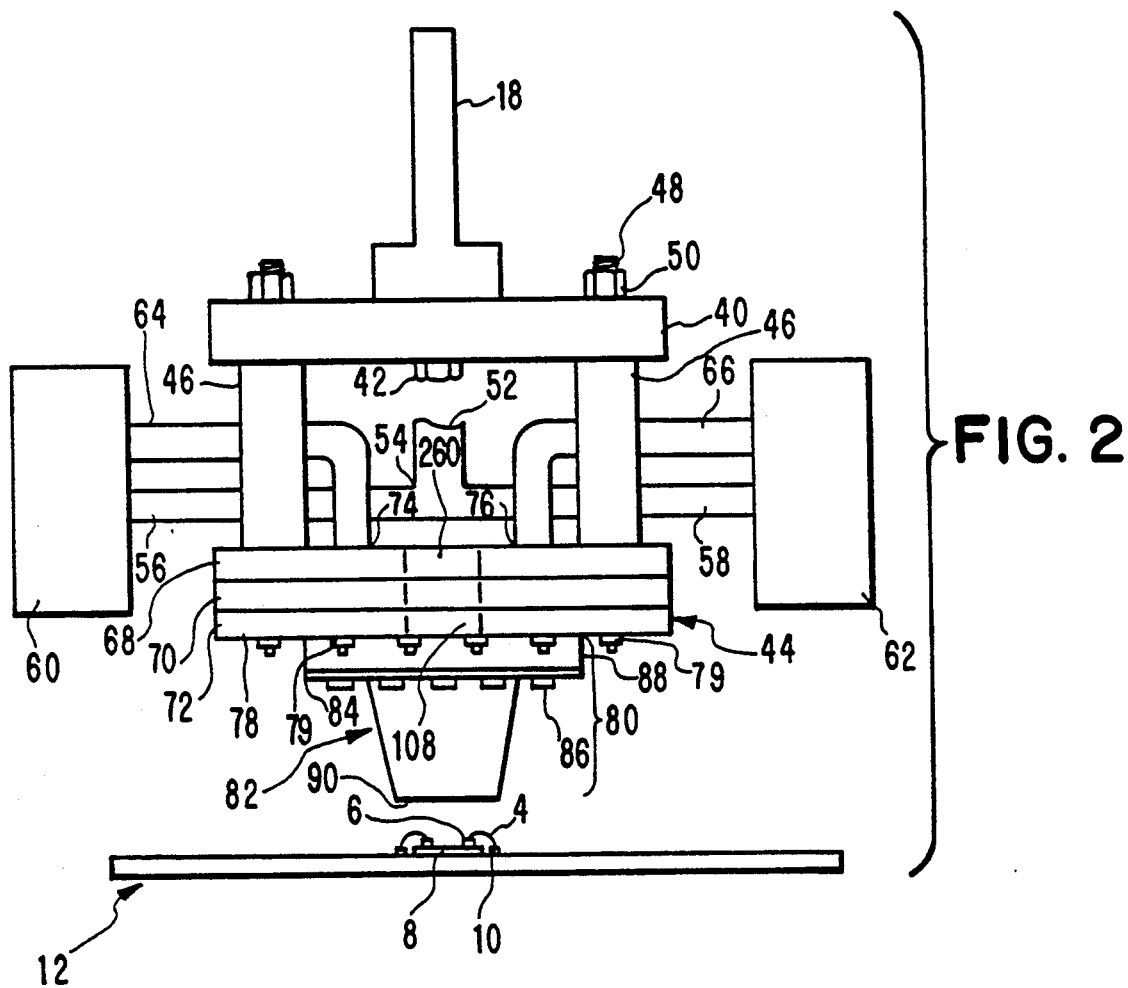
FIG. 2 shows a side view of a preferred embodiment of the present invention.

FIG. 2 shows a side elevation view of a preferred embodiment of the present invention. Numbers common between FIGS. 1 and 2 represent the same thing. A mechanical arm to move the apparatus of FIG. 2 which is not shown, grips onto support 18 which is fixedly mounted to a top plate 40 by means of threaded screw 42 which screws into a threaded cavity not shown in support 18. Top plate 40 is physically connected to manifold plate 44 by four elongated supports 46. In FIG. 2 only two of the supports 46 are shown since the view in FIG. 2 is a side elevational view. The top plate 40 is spaced apart from the bottom plate 44 by support 46 and each of the elements 40, 44 and 46 are held together by screws 48 and nut 50. Fluid flows into input pipe 52 which is split at T location 54 into pipe 56 and 58. Pipe 56 goes into a fluid control valve 60 and pipe 58 goes into fluid control valves 62. Suitable fluid control valves for 60 and 62 are, for example, Humphrey model 410. Control valve 60 has an output pipe 64 and control valve 62 has an output pipe 66. Output pipe 64 and 66 are connected to fluid distribution plate 44. (Pipes 64 and 66 correspond to pipes 24 and 26 of FIG. 1, respectively.) Fluid distribution plate 44 is made up of three plates: upper plate 68, middle plate 70 and lower plate 72 which are held together by the screws 79. Pipe 64 from valve 60 enters the upper plate at an aperture 74 and pipe 66 from valve 62 enters the upper plate 68 at an aperture 76. On the exposed side 78 of the lower plate 72 there is disposed a nozzle assembly 80 which has a truncated rectangular pyramid shaped nozzle piece 82 and a rectangular flange 88 which is disposed on surface 78. The nozzle 80 is fixedly mounted to surface 78 by means of a plurality of screws 86 which are inserted through a flange piece 88 of the nozzle piece 82 and through apertures in the retaining washer 84. Output end 90 of the nozzle 82 is shown disposed above a chip 8 mounted onto a substrate 12 having wires 4 bonded between chip contact location 6 and substrate contact location 10. All of the parts in FIGS. 1 and 2 of the apparatus can be made out of any suitable material such as aluminum, copper and the like. The pipes can be rubber, plastic or metal. The valves 60 and 62 are preferably electronically controlled, most preferably computer controlled. The valves have electronic inputs to shut off the fluid flow into pipe 64 and 66 which enter fluid distribution or manifold plate 44 of the apparatus. With the valves identified above oscillation frequencies from between about 2 Hz up to about 10 Hz can be achieved.

Figure 3:
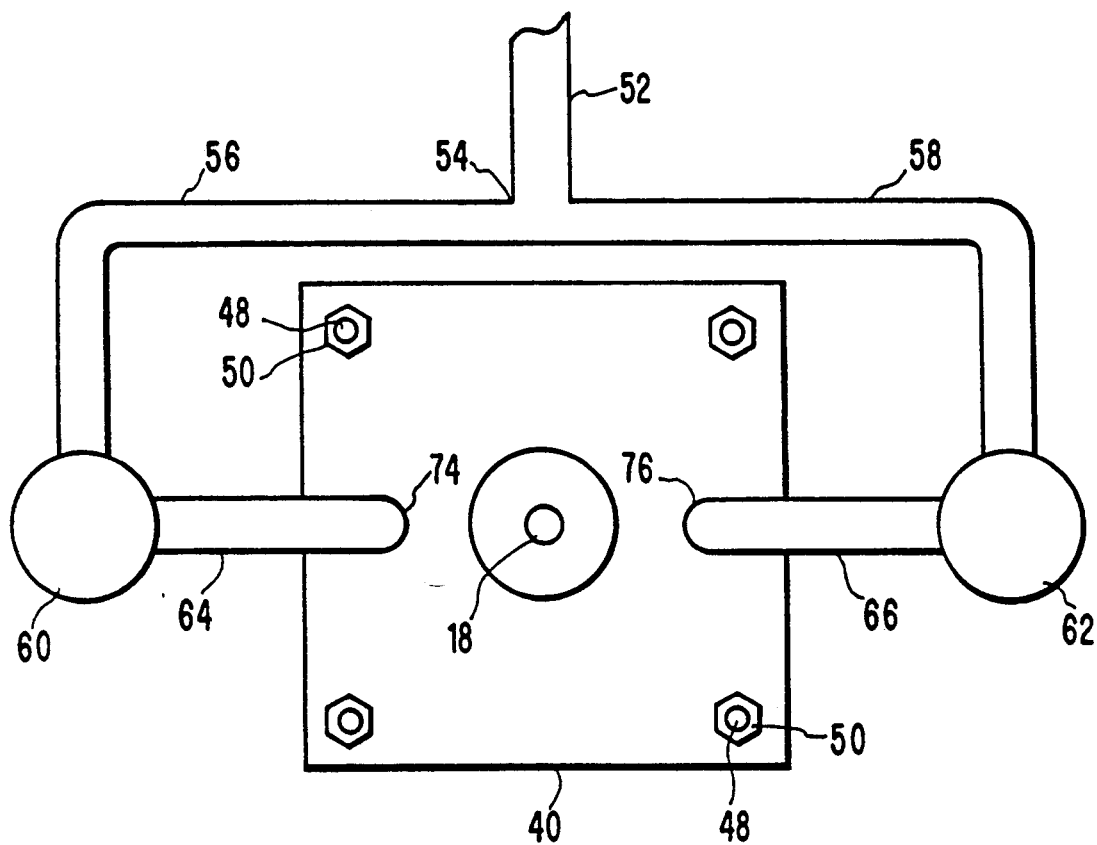
FIG. 3 shows a top view of a preferred embodiment of the present invention.

FIG. 3 is a top view of the apparatus of FIG. 2. All numbers common between FIG. 2 and FIG. 3 correspond to the same thing.

Figure 4:
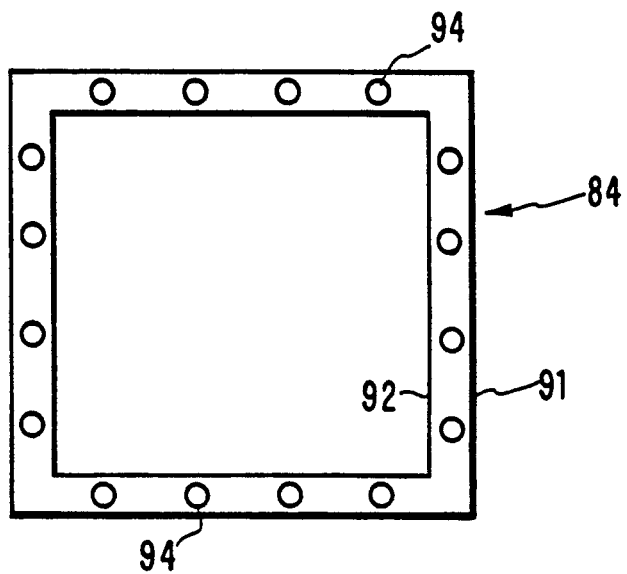
FIG. 4 shows a top view of a washer for retaining a preferred nozzle comprising a part of the present invention in contact with the fluid flow distribution plate.

FIG. 4 is a top view of retaining washer 84 in FIG. 2. Washer 84 is generally a rectangular angular shape having an outer edge 91 and an inner edge 92. There are a plurality of apertures 94 in the rectangular annular ring. The washer 84 is disposed over the nozzle against flanged base 88. Screws 86 are inserted through apertures 94 to fixedly mount nozzle 82 to surface 78 of bottom plate 44.

Figure 5:
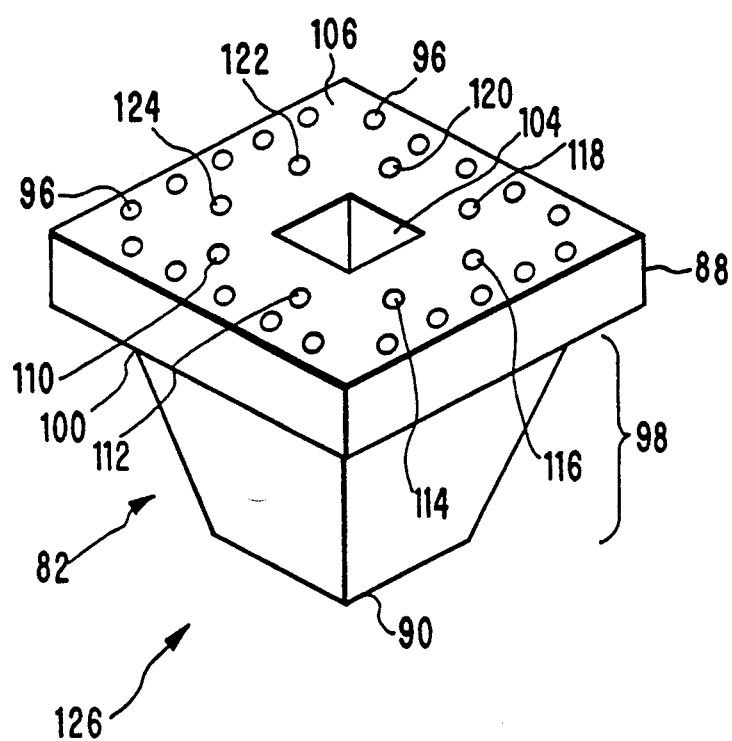
FIG. 5 shows a perspective view of a preferred nozzle comprising a part of the present invention.

FIG. 5 is a perspective view at a downward angle of the nozzle 82. The nozzle has a flange 88 for attachment to surface 78 of FIG. 2. At the periphery of the flange 88 there are a plurality of apertures 96 for receiving screws 86 of FIG. 2. The apertures 96 correspond to the apertures 94 of the washer 84 of FIG. 4. The nozzle 82 is composed of the flange 88 and nozzle end 98. Nozzle end 98 has a truncated rectangular pyramid shape. This shape is not limiting. Any suitable shape can be used. The truncated pyramid has a top end 100 which is connected to the flange piece 88. The nozzle end 98 has a bottom end 90 which is disposed adjacent the wires to be removed. The nozzle 82 is generally a single piece of material. In the preferred embodiment, the nozzle is formed from an elastomeric material, e.g., a molded silicon rubber, for example Elcosil 5019, manufactured by Emmerson and Cummings, Inc., into which the apertures 96 are drilled. Through the center of the pyramid there is an opening 104 which extends from end 90 of nozzle 82 to the surface 106 of the flange which is disposed against surface 78 of FIG. 2. The aperture 104 of the nozzle 82 is aligned with an aperture which extends through bottom plate 44 of FIG. 2, which is shown in phantom in FIG. 2 as 108. Since chips generally have a rectangular shape and most typically a square shape, nozzle piece 82 has four sets of input and output jets. Each pair corresponds to the nozzle 30 and 32 of FIG. 1. On surface 106 of nozzle 82 there are four groups of air passages. Group one composed of passage 110 and 112, group 2 composed of passage 114 and 116, group three composed of passage 118 and 120 and group four composed of passage 122 and 124. A fluid is alternated between the two passage members of each group. In this way the wire bonds along the four sides of a rectangular chip are simultaneously oscillated back and forth and simultaneously severed and removed. For example, during one oscillation a fluid is passed into passage 110, 114, 118 and 122. On the other part of the oscillation, a fluid is passed into passage 112, 116, 120 and 124.

Figure 6:
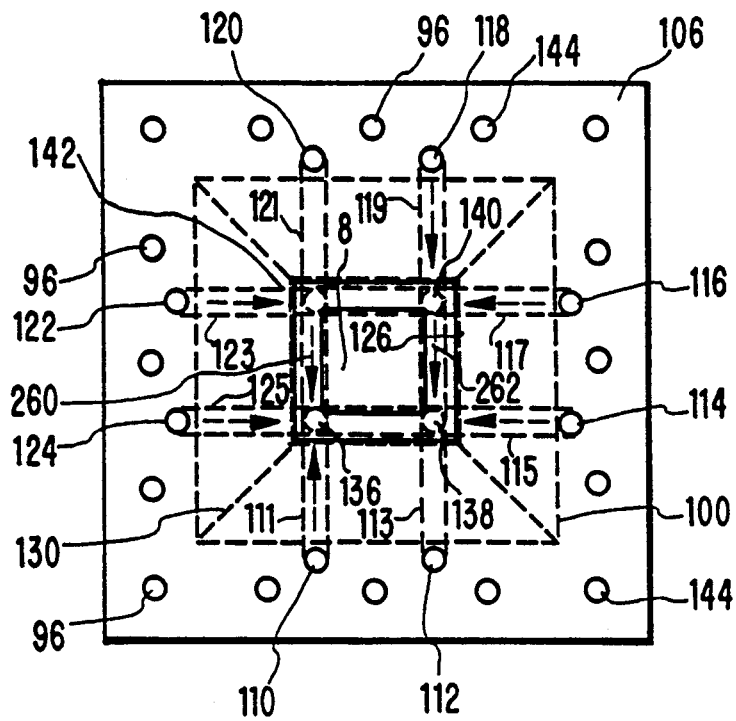
FIG. 6 shows a top view of a preferred nozzle comprising a part of the present invention.

FIG. 6 shows a top view of surface 106 of nozzle 82. Numbers common between FIG. 6 and FIG. 5 correspond to the same thing.

Figure 7:
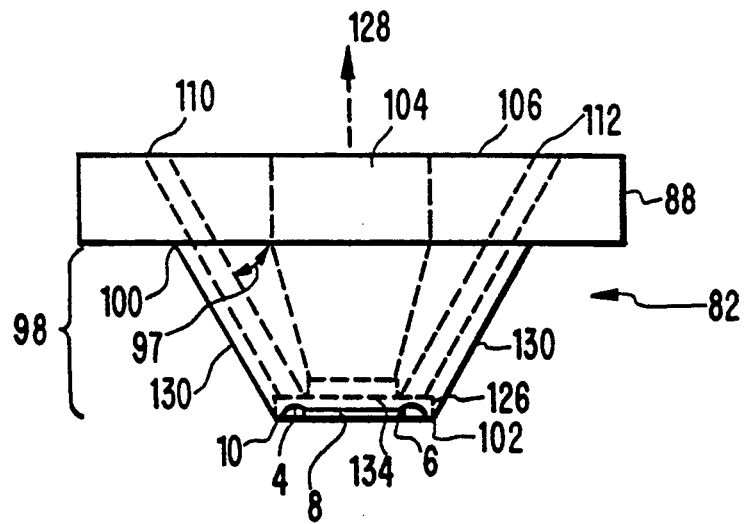
FIG. 7 shows a side view of a preferred nozzle comprising a part of the present invention.
Figure 8:
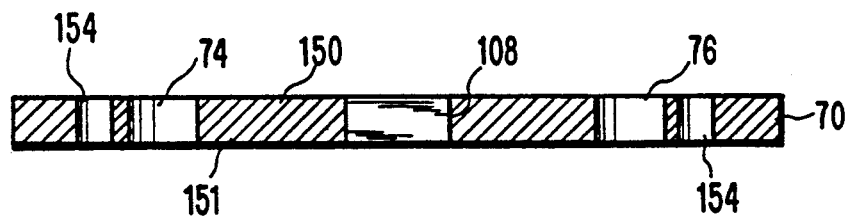
FIG. 8 shows a top view of a top plate of a fluid distribution plate comprising a part of the present invention.
Figure 8:
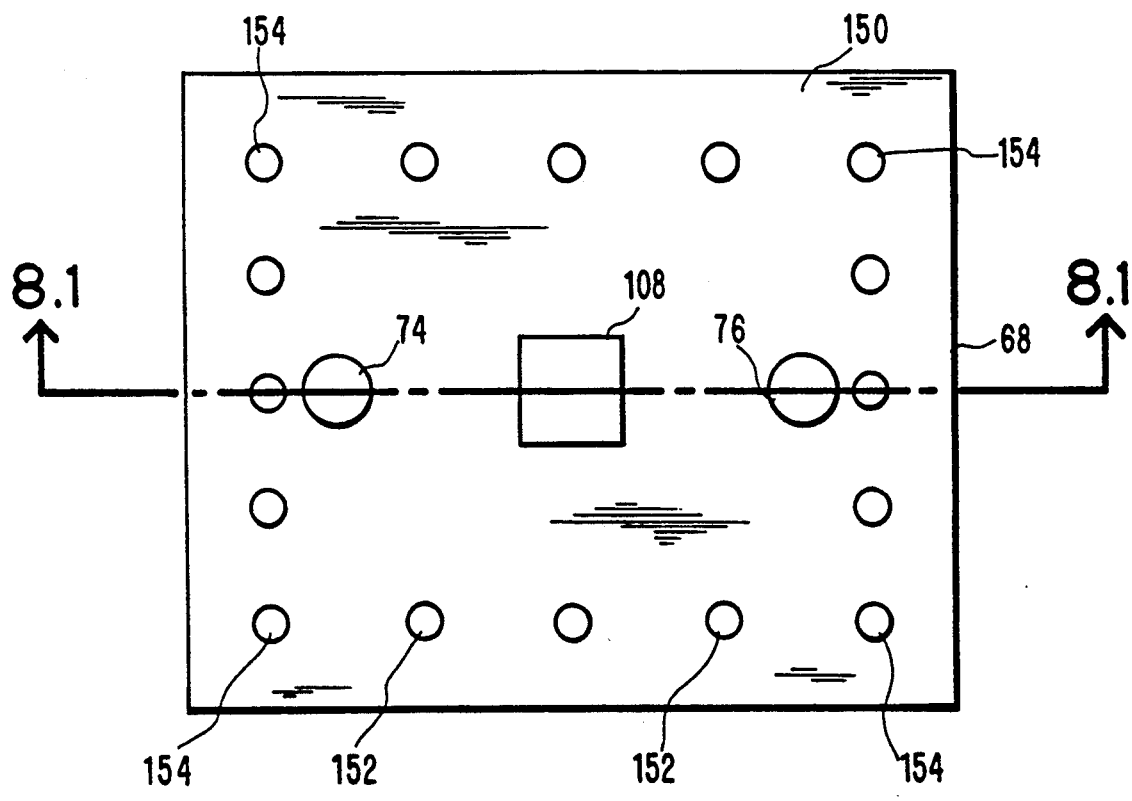

FIG. 7 shows a side view in direction 126 of FIG. 5 with air passages 110 and 112 shown in phantom. Numbers common between FIGS. 5, 6 and 7 correspond to the same thing. The central aperture 104 through the piece 82 is also shown in phantom. It is seen that the central aperture does not have uniformed dimensions from surface 106 to bottom 90 of the nozzle but has a variation in cross sectional dimension generally corresponding to the pyramidal shape of the nozzle 82. At end 90 of the nozzle 82 there is a rectangularly shaped well 126 within which semiconductor chip 8 and bonding wires 4 and substrate contact locations 10 are contained. At least end 90 of nozzle 82 is preferably made of an elastomeric material so that when end 90 of nozzle piece 82 is disposed against a substrate surface 10 of FIG. 1 there is a seal made there between thereby resulting in the fluid flowing in the fluid channels 110, 112, 114, 116, 118, 120, 122 and 124 being directed onto the wires 104 and upwardly out through aperture 104 in nozzle 82 in the direction of dashed line 128 in FIG. 7. The seal substantially prevents fluid from flowing out of the enclosed region. The base 100 of the nozzle pyramid 98 is shown in FIG. 6 as a dashed line and the sides 130 of the pyramid are shown in dashed lines in FIG. 6. The top surface 134 of the rectangularly shaped well 126 has four output ports 136, 138, 140 and 142 which are connected to the eight fluid channels 110, 112, 114, 116, 118, 120, 122 and 124. Each output port is connected to a fluid channel corresponding to a different edge of the chip. For example, fluid channel 124 and 110 share output port 136. Fluid channel 112 and 114 share output port 138. Fluid channel 116 and 118 share output port 140. Fluid channel 120 and 122 share output port 142. The output ports 136, 138, 140 and 142 are shaped to permit the fluid directed into the fluid channels to be directed in a direction generally parallel to the four chip edges. The fluid channels are formed by drilling into the molded nozzle piece 82. FIG. 8 is a top view of the upper plate 68 of the fluid distribution plate or bottom plate 44 of the apparatus of FIG. 2. FIG. 8.1 is a cross sectional view of the top plate of FIG. 8 along line 8.1—8.1. Plate 68 has an aperture therein 108 which is shown in phantom in FIG. 2. The top surface 150 of plate 68 has apertures 74 and 76 therein for receiving fluid pipes 64 and 66 as shown in FIG. 2. Around the periphery of plate 68 there are a plurality of apertures 152 which are for receiving screws which hold the plates 68, 70 and 72 together. The screws 79 in FIG. 2 are inserted through the aperture 152. In the vicinity of the corners of the top plate 68 there are a plurality of apertures 154 which are for receiving screw 48 as shown in FIG. 2.

Figure 9:
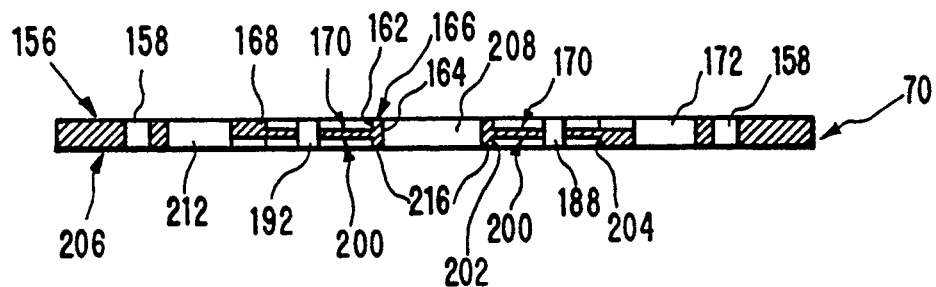
FIG. 9 shows a top view of a middle plate of a fluid distribution plate comprising a part of the present invention.
Figure 9:
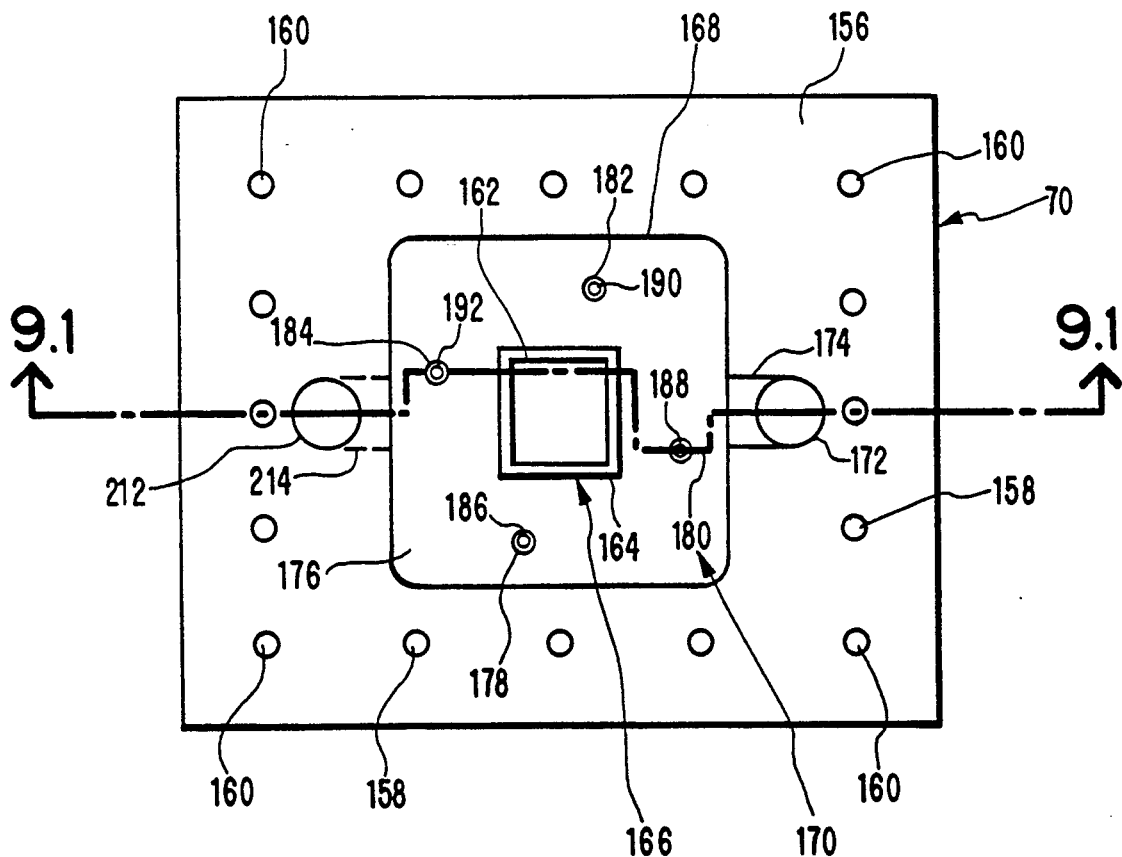

FIG. 9 shows a top view of surface 156 of the middle plate 70 of the fluid distribution plate 44 of FIG. 2. Surface 156 is disposed against surface 151 of the upper plate of fluid distribution plate or 44. About the periphery of plate 70 there are a plurality of apertures 158 which are aligned with the apertures 152 of FIG. 8 and are for receiving the same screws which go through apertures 152 for holding together manifold 44 of FIG. 2. In the corners of the plate 70 there are a plurality of apertures 160 which are aligned with apertures 154 of FIG. 8 and which receive screw 48 as shown in FIG. 2. At the center of the plate 70 there is a rectangularly shaped structure 162 which aligns with aperture 108 of FIG. 8. Surrounding rectangular structure 162 is rectangular structure 164. The space between rectangular structure 164 and 162 forms a sidewall 166. FIG. 9.1 shows the structure of FIG. 9 in cross section along line 9.1—9.1. Numbers common between FIG. 9.1 and FIG. 9 correspond to the same thing. Surrounding the rectangular angular shaped structure 166 is a generally rectangular shape structure 168. The space between rectangularly shaped structure 164 and 168 designated as 170 forms a fluid transfer space on the top side 156 of plate 70. In surface 156 there is a circular aperture 172 which is aligned with aperture 76 of plate 68 as shown in FIG. 8. Aperture 172 is connected to fluid duct 174 which is connected to fluid space 170. In the bottom 176 of fluid space 170 there are four apertures 178, 180, 182 and 184. In these apertures are inserted pipes shown as circles 186, 188, 190 and 192. These pipes are for fluid communication between apertures 110, 114, 118 and 122 and the top face 106 of nozzle 182 as shown in FIGS. 6 and 7. Below fluid space 170 there is fluid space 200 which is defined by an interior wall 202 and an exterior wall 204 as shown in FIG. 9.1. Fluid space 200 is on side 206 of plate 70. Side 206 is opposite to side 156 as shown in FIG. 9.1. Fluid space 200 is separated from exhaust aperture 208 by sidewall 210 which is defined by sidewall 164 and 202. Through plate 70 there is a fluid flow aperture 212 which is aligned with fluid flow aperture 74 as shown in FIG. 8. Fluid flow aperture is in physical connection with fluid space 200 by means of fluid duct 214 shown in phantom in FIG. 9. Surface 156 of middle plate 70 is disposed against surface 151 of plate 68 of FIG. 8.1 which results in an enclosed fluid space 170. Surface 206 of plate 70 is disposed against surface 220 of FIGS. 10 and 10.1 to form an enclosed fluid space 200.

Figure 10:
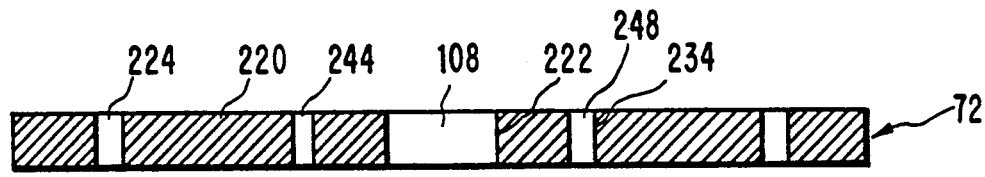
FIG. 10 shows a top view of a bottom plate of a fluid distribution plate comprising a part of the present invention.
Figure 10:
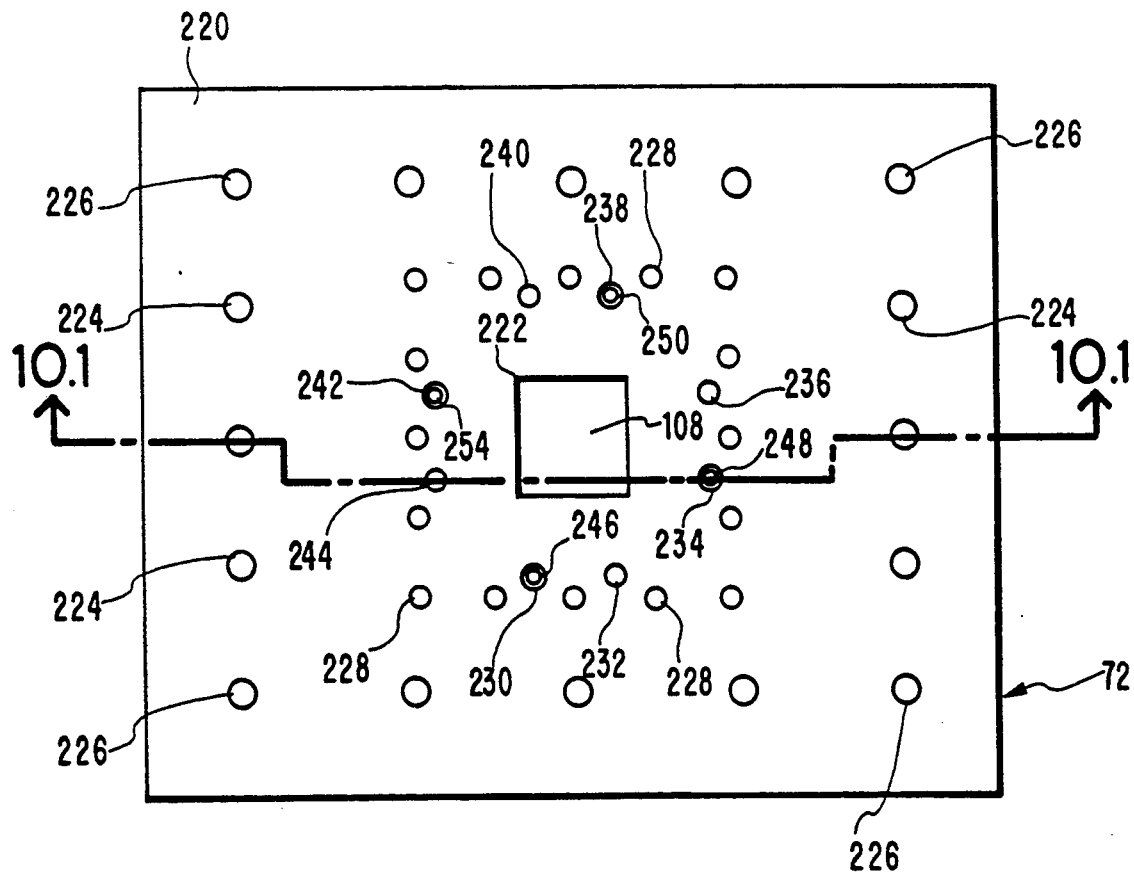

FIG. 10 shows a top view of lower plate 72 of manifold 44 of FIG. 2. Rectangular shape 202 at the center of plate 72 is the perimeter of central space 108 of manifold plate 44 as shown in FIG. 2. Surrounding the periphery of lower plate 72 there are a plurality of apertures 224 which align with apertures 154 of upper plate 68 of FIG. 8 and with aperture 160 of middle plate 170. These aperture receive a bolt to hold manifold plate 44 together. At the corners of plate 72 there are a plurality of apertures 226 which align with the apertures 154 of plate 68 as shown in FIG. 8 and are for receiving bolts 48 as shown in FIG. 2 for holding the apparatus of FIG. 2 together as described herein above. Surrounding the central aperture 222 there are a plurality of apertures 228 which are for receiving screws 86 which hold nozzle 82 onto manifold plate 44 of FIG. 2. Surrounding central aperture 222 there are a plurality of apertures for transmitting a fluid 230, 232, 234, 236, 238, 240, 242 and 244. Apertures 230, 234, 238 and 242 have inserted therein pipes, the interior walls of which are 246, 248, 250 and 254. These four pipes are the same pipes as pipes 186, 188, 190 and 192 of FIG. 9 and are connected therewith to provide a fluid connection between fluid chamber 170 and nozzle 82 of FIG. 2. The remaining fluid apertures 232, 236, 240 and 244 are aligned with cavity 200 of plate 68 as shown in FIG. 9.1 so that fluid entering cavity 200 will pass through apertures 232, 236, 240 and 244. Fluid passes through pipes 246, 248, 250 and 254 from fluid chamber 170 shown in FIG. 9.1. Apertures 230, 232, 234, 236, 238, 240, 242 and 244 align with pipes 120, 118, 116, 114, 112, 110, 124 and 122 respectively in the top surface 106 of the nozzle 82 as shown in FIG. 6. Therefore, fluid chamber 170 is in fluid communication with pipe 121, pipe 117, pipe 113 and pipe 125 and fluid chamber 200 of plate 70 as shown in FIG. 9.1 is in fluid communication with pipe 119, 115, 111 and 123 of FIG. 6. When fluid is forced into chamber 170 through pipe 66 as shown in FIG. 2 fluid is forced to flow in a counter clockwise direction about the periphery of semiconductor chip 8 as indicated by arrow 260 in FIG. 6. When fluid is forced into chamber 200 of plate 70 of FIG. 9.1, the fluid is forced to flow in a clockwise direction about the periphery of chip 8 as indicated by arrow 262 of FIG. 6. This alternating flow of the fluid in a clockwise direction and a counter clockwise direction about the chip periphery will push the wires 4 as shown in FIG. 7 alternately back and forth. The wires described above will eventually break at the two contact locations with the chip contact pad 6 and the substrate contact pad 10 and are thereby removed. The fluid flow into the rectangularly shaped cavity 126 of FIG. 7 which is enclosing the chip is sufficiently great to force the severed wires upwardly through cavity 104 of FIG. 7 in the direction 128. At the upper end 260 of cavity 108 of bottom plate 44 of FIG. 2 there can be disposed a vacuum suction device to collect the severed wires. FIG. 10.1 is a cross sectional view of bottom plate 72 of FIG. 2 along line 10.1—10.1.

Figure 11:
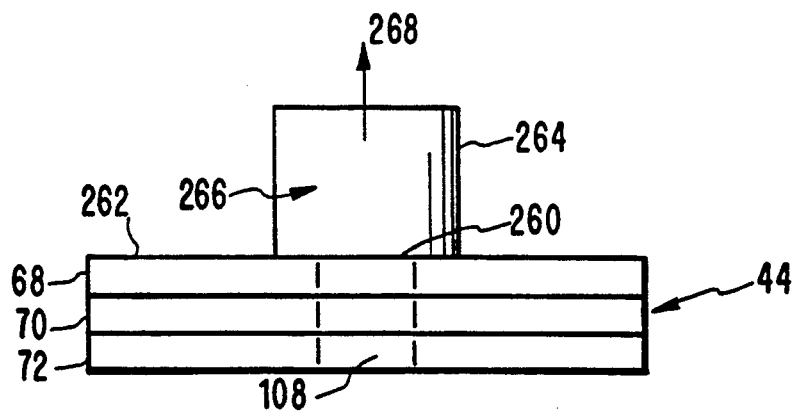
FIG. 11 is a side view of plate 44 of FIG. 2 with a filter means mounted thereon for collection of severed wires.

Alternatively, as shown in FIG. 11, on surface 260 of bottom plate 44 covering end 260 of aperture 108 there can be disposed a fluid permeable filter which permits the fluid to pass through the outer wall 264 of the filter 266 as shown by arrow 268 and to capture the severed wires.

EXAMPLE

Fluid input pipe 52 of FIG. 2 has a cross sectional area 0.1104 in$^2$ Pipes 56 and 58 have cross sectional areas 0.0491 in$^2$. Pipe 64 and 66 have cross sectional area 0.0491 in$^2$. Pipes 110, 112, 114, 116, 118, 120, 122 and 124 have cross sectional areas 0.0069 in$^2$. Fluid exit aperture 136, 138, 140 and 144 have cross sectional areas 0.0069 in$^2$. Angle 97 is about 30°. To sever aluminum wires having cross sectional area 0.000006 in$^2$ bonded between a copper contact pad with a gold top surface and with a substrate copper contact pad with a gold top surface to which the wire is thermocompression bonded requires an input gas speed of 600 ft/sec. with 32 oscillations to sever 100 wire bonds substantially simultaneously from a semiconductor chip having 9 millimeters per side.

In summary, applicants have discovered an apparatus and method for using an alternating fluid flow to sever one or more wires bonded between two locations. Alternating fluid flow pushes the wire or wires back and forth until fatigue causes the wires to break in the vicinity of the connection of the wire to the contact locations. This apparatus and method, in particular, permits low cost rework of the effective semiconductor chips which are bonded onto packaging substrates.

It is to be understood that the above described embodiments are simply illustrative of the principles of the invention. Various other modifications and changes may be devised by those of skill in the art which will embody the principles of the invention and fall within the spirit and scope thereof.

We claim:

1. An apparatus for removing an elongated member fixedly mounted to a workpiece using a fluid comprising:
   a first nozzle through which said fluid can flow;
   a second nozzle through which said fluid can flow;
   means for alternating said fluid flow from said first nozzle and said second nozzle against said elongated member so that when said fluid flow is alternated over said elongated member, said elongated member is broken and removed from said workpiece.

2. The apparatus of claim 1, wherein said elongated member has a first location and a second location fixedly bonded to said workpiece.

3. The apparatus of claim 2, wherein said workpiece is a semiconductor chip mounted on a substrate and wherein said elongated member is a wire bonded to said first and second location.

4. The apparatus of claim 1, wherein said fluid is a gas.

5. The apparatus of claim 4, wherein said gas is air.

6. The apparatus of claim 1, wherein said elongated member is removed from said workpiece by fatigue failure to said member.

7. An apparatus for removing a plurality of wires each bonded between a first contact location and a second contact location on an electronic workpiece using a fluid comprising:
   a fluid input;
   a plurality of fluid output nozzles;
   a means for directing said fluid to preselected members of said plurality of output nozzles and against said plurality of wires so that said fluid is directed to flow in a manner to move said plurality of wires in a back and forth motion which causes said plurality of wires to break away from said first and said second contact locations.

8. The apparatus of claim 7, further including a means for containing said plurality of wires, said first contact locations and said second contact locations within a substantially enclosed space, said output nozzles being directed within said substantially enclosed space.

9. The apparatus of claim 8, wherein said means for containing comprises a nozzle head having a well therein for receiving said workpiece, said well having an edge for being disposed in engagement with said workpiece to thereby form said enclosed space.

10. The apparatus of claim 9, wherein said means for directing said fluid directs said fluid alternatively between a first group of preselected members of said plurality of output nozzles and a second group of preselected members of said plurality of output nozzles so that there is alternately a clockwise and a counter clockwise flow of said fluid around said workpiece.

11. The apparatus of claim 8, further including in said nozzle head an aperture out through which said wires are directed after being broken away from said first and said second contact locations.

12. The apparatus of claim 11, further including a means for collecting said wires.

13. The apparatus of claim 9, wherein said edge is pliable and forms a fluid seal with said workpiece.

14. The apparatus of claim 8, wherein said means for containing is disposed in contact with a fluid distribution means for distributing said fluid at said fluid input between a first group of said preselected members of said plurality output nozzles and a second group of said preselected members of said plurality of output nozzles.

15. The apparatus of claim 14, wherein said fluid distribution means comprises:
   a means for splitting said fluid input between a first valve and a second valve;
   a fluid output from said first valve is connected to a fluid manifold;
   a fluid output from said second valve is connected to said fluid manifold;
   said fluid manifold contains fluid ducts to direct fluid from said first valve to said first group of said preselected members of said output nozzles; and
   said fluid manifold contains fluid ducts to direct said fluid from said second fluid valve to said second group of preselected members of said fluid output nozzles.

16. The apparatus of claim 15, further including an electronic control means to control said first fluid valve and second fluid valve so that fluid passes alternately from said first group of preselected members of said fluid output nozzles and said second group of preselected members of said fluid output nozzles.

17. The apparatus of claim 7, wherein said fluid is a gas.

18. The apparatus of claim 17, wherein said gas is air.

19. An apparatus for removing a plurality of wires each bonded between a first contact location and a second contact location on an electronic workpiece using a fluid comprising:
   a fluid input tube;
   said fluid input tube splitting between a first fluid valve input tube and a second fluid valve input tube;
   said first fluid valve input tube is connected to a first fluid valve;
   said second fluid valve input tube is connected to a second fluid valve;
   a fluid manifold having fluid passages;
   a first fluid valve output from said first fluid valve is directed to a first input to said fluid manifold;
   a second fluid valve output from said second fluid valve is directed to a second input to said fluid manifold;
   a nozzle head having a plurality of nozzles disposed in fluid contact with said fluid passages of said fluid manifold;

said fluid manifold has a first plurality of interconnected fluid passages interconnecting said first input to said fluid manifold with a first group of said plurality of nozzles in said nozzle head;

said fluid manifold has a second plurality of interconnected fluid passages interconnecting said second input to said fluid manifold with a second group of said plurality of nozzles in said nozzle head;

said nozzle head has a cavity therein adapted to enclose said workpiece;

said cavity containing said plurality of nozzles;

said nozzle head has an exit aperture through which said plurality of wires exit from said nozzle head; and means for controlling said first fluid valve and said second fluid valve so that said fluid alternately passes out from said first group and said second group of said plurality of nozzles so that said wires are oscillated back and forth thereby severing said plurality of wires from said first and said second contact locations, said wires exiting through said exit aperture.

20. A method of removing a wire bonded between a first contact location and a second contact location on an electronic workpiece using a fluid comprising:

holding said workpiece;

alternating over said wire a fluid stream to push said wire back and forth until said wire breaks away from said workpiece.

* * * * *